United States Patent [19]

Kaneko

[11] Patent Number: 5,642,060
[45] Date of Patent: Jun. 24, 1997

[54] CLOCK GENERATOR

[75] Inventor: Satoshi Kaneko, Tokyo, Japan

[73] Assignee: Mitsubishi Denki Kabushiki Kaisha, Tokyo, Japan

[21] Appl. No.: 604,432

[22] Filed: Feb. 21, 1996

[30] Foreign Application Priority Data

Aug. 3, 1995 [JP] Japan .................. 7-198849

[51] Int. Cl.$^6$ .................................. H03K 19/096
[52] U.S. Cl. ........................ 326/93; 327/291
[58] Field of Search .............. 326/93, 94; 327/291, 327/293–4, 298–9

[56] References Cited

U.S. PATENT DOCUMENTS

| | | | |
|---|---|---|---|
| 5,289,050 | 2/1994 | Ogasawara | 326/93 |
| 5,389,830 | 2/1995 | Buckingham | 327/291 |
| 5,420,467 | 5/1995 | Huott | 327/294 |
| 5,475,322 | 12/1995 | MacDonald | 326/93 |

*Primary Examiner*—Edward P. Westin
*Assistant Examiner*—Benjamin D. Driscoll
*Attorney, Agent, or Firm*—Burns, Doane, Swecker & Mathis, LLP

[57] ABSTRACT

A clock generator comprising inverters $I_{1A}$, $I_{1B}$, $I_{2A}$, a NOR circuit $NO_1$, an inverter $I_{3A}$ and a NOR circuit $NO_2$ ... which transmit sequentially an input clock signal A, D flip-flops $DF_1$, $DF_2$, $DF_3$ ... which latches the input clock signal at different positions during transmission, NAND circuits $N_1$, $N_2$, $N_3$ ... which output intermediate signals A1, A2, A3 ... in response to latch data of the D flip-flops $DF_1$ $DF_2$, $DF_3$ ... and the input clock signal, and a multi-input AND circuit $AN_0$ to which the intermediate signals A1, A2, A3 are inputted, and being configured so as to input each signal based on the latch data of adjacent D flip-flops to the NOR circuits $NO_1$ and $NO_2$, thereby duty of an output clock signal generated based on the input clock signal does not become small even when the input clock signal having high frequency is inputted.

2 Claims, 6 Drawing Sheets

CLOCK GENERATOR

BACKGROUND OF THE INVENTION

1. Field of the Invention

The present invention relates to a clock generator which generates clock signals.

2. Description of Related Art

FIG. 1 is a schematic diagram of a clock generator. The clock generator CG is configured so as to input an input clock signal A and a reference signal B, and output an output clock signal C. Specifically, as shown in a timing chart of the timing relationship of the input clock signal A, the reference signal B and the output clock signal C, the clock generator CG outputs the input clock signal A, which is asynchronous with the reference signal B, as the output clock signal C in synchronism with the rising timing (or falling timing) of the reference signal B.

FIG. 3 is a logical circuit diagram showing a configuration example of this kind of clock generator.

The input clock A is inputted to an inverter $I_{1A}$ and an input terminal D of a D flip-flop $DF_1$. An output signal of the inverter $I_{1A}$ is inputted to one input terminal of a NAND circuit $N_1$ and an inverter $I_{1B}$. An output signal from an output terminal Q of the D flip-flop $DF_1$ is inputted to one input terminal of an AND circuit $AN_1$, and all output signal of the AND circuit $AN_1$ is inputted to the other input terminal of the NAND circuit $N_1$. All output signal of the NAND circuit $N_1$ is inputted to a first input terminal $a_1$ of a multi-input AND circuit $AN_0$. An output signal of the inverter $I_{1B}$ is inputted to an inverter $I_{2A}$ and an input terminal D of a D flip-flop $DF_2$. An output signal of the inverter $I_{2A}$ is inputted to one input terminal of a NAND circuit $N_2$ and an inverter $I_{2B}$.

An output signal from an output terminal Q of the D flip-flop $DF_2$, is inputted to one input terminal of an AND circuit $AN_2$. An output signal of the AND circuit $AN_2$ is inputted to the other input terminal of the NAND circuit $N_2$, and an output signal of the NAND circuit $N_2$ is inputted to a second input terminal $a_2$ of the multi-input AND circuit $AN_0$. An inverted output signal from an inverted output terminal #Q of the D flip-flop $DF_2$ is inputted to the other input terminal of the AND circuit $AN_1$. An output signal of the inverter $I_{2B}$ is inputted to an inverter $I_{3A}$ and an input terminal D of a flop-flop $DF_3$. An output signal of the inverter $I_{3A}$ is inputted to an inverter $I_{3B}$ and one input terminal of a NAND circuit $N_3$. An output signal of the NAND circuit $N_3$ is inputted to a third input terminal $a_3$ of the multi-input AND circuit $AN_0$. An output signal from an output terminal Q of the D flip-flop $DF_3$ is inputted to one input terminal of an AND circuit $AN_3$. An output signal of the AND circuit $AN_3$ is inputted to the other input terminal of the NAND circuit $N_3$. An inverted output signal from an inverted output terminal #Q of the D flip-flop $DF_3$ is inputted to the other input terminal of the AND circuit $AN_2$. To each trigger terminal T of the D flip-flop $DF_1$, $DF_2$, $DF_3$ is inputted commonly the reference signal B.

As a result, the output clock signal C is outputted from the multi-input AND circuit $AN_0$. A unit circuit $U_1$ ($U_2$, $U_3$) is composed of the inverter $I_{1A}$ ($I_{2A}$, $I_{3A}$), the inverter $I_{1B}$ ($I_{2B}$, $I_{3B}$), the D flip-flop $DF_1$ ($DF_2$, $DF_3$), the AND circuit $AN_1$ ($AN_2$, $AN_3$) and the NAND circuit $N_1$ ($N_2$, $N_3$). In FIG. 3, a state in which the unit circuits $U_1$, $U_2$ and $U_3$ are connected in cascade is shown. In the actual circuit, a plurality of unit circuits each the same as the unit circuits $U_1$, $U_2$ and $U_3$ are connected in cascade.

Next, an operation of the conventional clock generator configured as mentioned above is described referring to a timing chart of the relationship among each signal shown in FIG. 4.

When the input clock signal A is inputted to the clock generator, it is transmitted through the inverter $I_{1A}$, $I_{1B}$, $I_{2A}$, $I_{2B}$, $I_{3A}$, $I_{3B}$ . . . successively. In general, in a case where a clock signal is inputted to an inverter, the inverter outputs the clock signal with slight delay because the inverter has a delay time of a gate operation.

Therefore, a phase delay of the input clock signal A accumulates by a slight delay at every passage through inverter, the phase of the clock at a node $M_1$ to which a signal is outputted from the inverter $I_{1B}$, at a node $M_2$ to which a signal is outputted from the inverter $I_{2B}$, and at a node $M_3$ to which a signal is outputted from the inverter $I_{3B}$ is delayed successively.

When the reference signal B rises, each D flip-flop $DF_1$, $DF_2$, $DF_3$ . . . latches simultaneously a value of the input clock signal A whose phase at each node $M_1$, $M_2$, $M_3$ . . . is slightly delayed. By this operation, each D flip-flop latches data of "H" or "L". Therefore, the following state occurs: between adjacent two D flip-flops a latch data of the D flip-flop positioned at the upstream side of the input clock signal A becomes "H", and a latch data of the D flip-flop positioned at the downstream side of the input clock signal A becomes "L". For example, when the D flip-flop $DF_2$ latches data of "H" and the D flip-flop $DF_3$ latches data of "L", an inverted output signal having "H" level is inputted to the AND circuit $AN_2$, so that the output signal of the AND circuit $AN_2$ becomes "H". By this reason, the NAND circuit $N_2$ to which the output signal of the AND circuit $AN_2$ is inputted enters a state in which the clock signal can be transmitted.

As described above, the state in which the latch data of the D flip-flop positioned at the upstream side of the input clock signal A becomes "H" and the latch data of the D flip-flop positioned at the downstream side of the input clock signal A becomes "L" occurs at plural positions because the input clock A is delayed slightly at every passage through the inverter. Therefore, the number of NAND circuits which enter a state in which the clock signal can be transmitted increases. On the other hand, in the case where both latch data of the adjacent two D flip-flops are "H", the output signal of the AND circuit to which abovementioned two latch data are inputted becomes "L", so that the output signal of the NAND circuit to which the output signal of abovementioned AND circuit is inputted is fixed to "H". By such a manner, a number of NAND circuits have output signals which are fixed to "H". Then, intermediate signals A1, A2, A3 . . . which are the output signals of abovementioned NAND circuits are inputted to the multi-input AND circuit $AN_0$, so that the output clock C rises at the time point when the logic of the intermediate signals from the plural NAND circuits which can transmit the input clock signal A is established, and the output clock signal falls at the time point when the logic is not established. As a result, an output clock signal C in synchronism with the reference signal B is generated.

Now, in the abovementioned conventional clock generator, the output clock signal rises at the time point when the logic of the plural intermediate signals outputted corresponding to the input clock from the NAND circuits which enter the state in which it is possible to transmit a clock signal is established. Therefore, in the case where the number of the intermediate signals outputted corresponding to the input clock increases, the establishing timing of the logic delays more and more. As mentioned above, however, the higher the frequency of the input clock signal becomes, the more the positions, between the adjacent two D flip-flops, at which data "H" is latched by the D flip-flop of the upstream side and data "L" is latched by the D flip-flop of the downstream side increase, so that the number of intermediate signals outputted from the unit circuits based on these latch data increases. Consequently, the higher the frequency of the input clock signal becomes, the more the rising timing of the clock delays, thereby the duty for the frequency of the output clock becomes small. Therefore, when a CPU is driven by the generated output clock signal of the conventional clock generator, there is a fear that the CPU malfunctions because of short margin according to frequencies of the input clock signal.

SUMMARY OF THE INVENTION

The present invention is devised in view of such problems. The object of the present invention is to provide a clock signal generator which generates an output clock having a large duty.

In a clock generator of the first aspect of the present invention, a first unit circuit is configured by a first inverter to which a clock signal is inputted, a second inverter which is connected to the first inverter in series, a first latch circuit to which the clock signal and a reference signal are inputted, a first logical circuit to which an output signal of the first latch circuit is inputted, and a second logical circuit to which an output signal of the first logical circuit and an output signal of the first inverter are inputted; and each of plural second unit circuits is configured by a third inverter to which a clock signal is inputted, a third logical circuit to which an output signal of the third inverter is inputted, a second latch circuit to which the clock signal being inputted to the third inverter and the reference signal are inputted, a fourth logical circuit to which an output signal of the second latch circuit is inputted, and a fifth logical circuit to which an output signal of the fourth logical circuit and an output signal of the third inverter are inputted. Also, each of the second unit circuits is connected in cascade so as to input the output signal of the third logical circuit of each of the second unit circuits to the third inverter of other second unit, the second inverter of the first circuit is connected to the third inverter of the second unit circuit of the first stage so as to input the output signal of the former to the later, an inverted output signal of the second latch circuit of the second unit circuit of the first stage is inputted to the first logical circuit of the first unit circuit, an inverted output signal of the second latch circuit of the second unit circuit of the succeeding stage is inputted to the fourth logical circuit of the second unit circuit of the preceding stage, the output signal of the first unit circuit is inputted to the third logical circuit of the second unit circuit of the preceding stage, the output signal of the fourth logical circuit of each of the second unit circuits is inputted to the third logical circuit of the second unit circuit of the succeeding stage, and a sixth logical circuit having plural inputs to which an output signal of the second logical circuit and each output signal of the plural fifth logical circuits.

A clock generator of the second aspect of the present invention is configured by comprising a register for storing data corresponding to the frequency regions of the clock signal, a signal generating circuit for generating a control signal based on the data of the register, and a logical circuit to which the control signal outputted from the signal generating circuit and the output signal of the second logical circuit of each unit circuit are inputted.

The above and further objects and features of the invention will more fully be apparent from the following detailed description with accompanying drawings.

DESCRIPTION OF THE PREFERRED EMBODIMENTS

Figure 1:
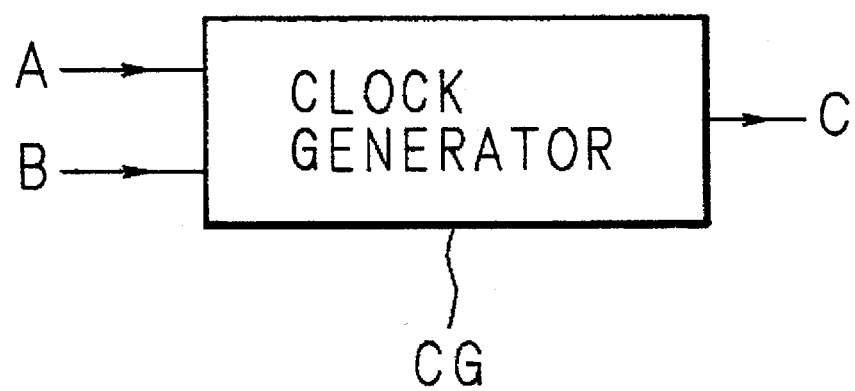
FIG. 1 is a schematic diagram of a clock generator.
Figure 2:
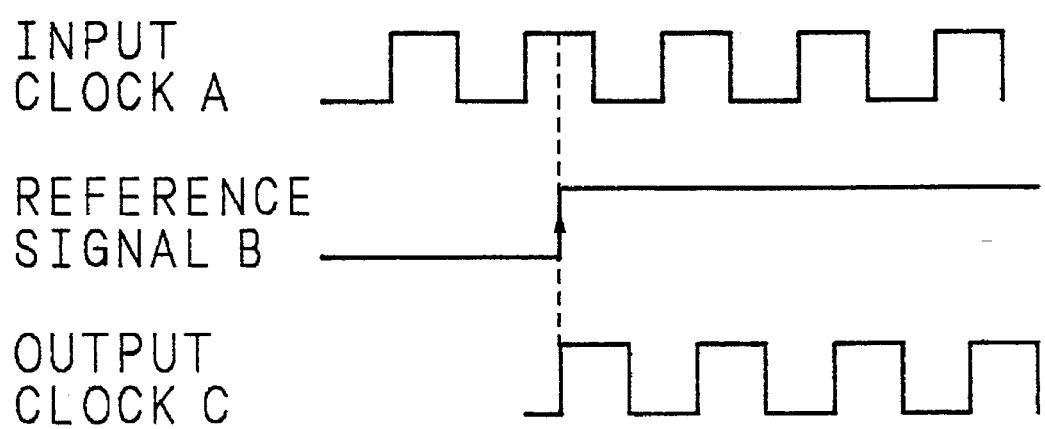
FIG. 2 is a timing chart of clocks and a signal of a conventional clock generator.

In the following, explanation will be made on detail of the present invention referring to the drawings showing the embodiments thereof.

[First Embodiment]

Figure 5:
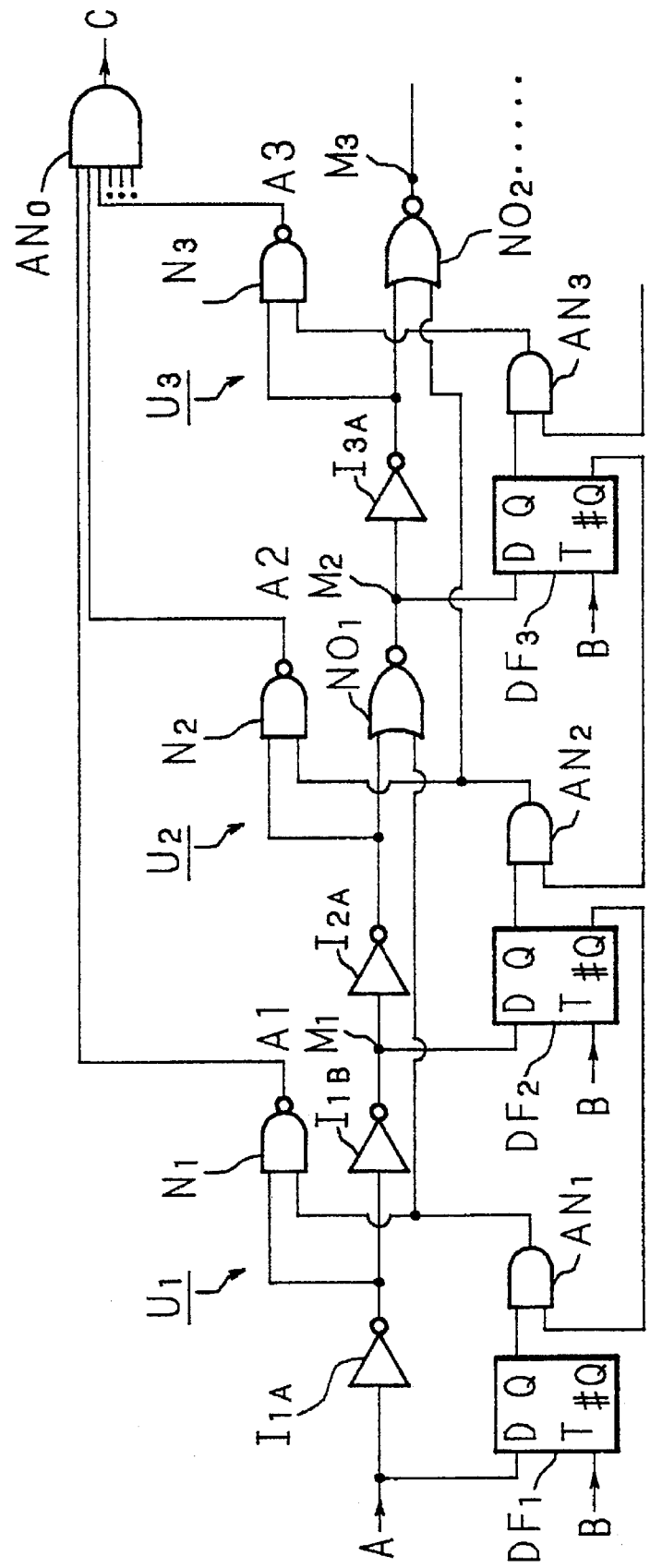
FIG. 5 is a logical circuit diagram showing a configuration example of a clock generator of a first embodiment in accordance with the present invention.

FIG. 5 is a logical circuit diagram showing a configuration example of a first embodiment of a clock generator in accordance with the present invention.

An input clock A is inputted to an inverter $I_{1A}$ and an input terminal D of a D flip-flop $DF_1$. An output signal of the inverter $I_{1A}$ is inputted to an inverter $I_{1B}$ and one input terminal of a NAND circuit $N_1$. An output signal from an output terminal Q of the D flip-flop $DF_1$ is inputted to one input terminal of an AND circuit $AN_1$. An output signal of the AND circuit $AN_1$ is inputted to the other input terminal of the NAND circuit $AN_1$ and one input terminal of a NOR circuit $NO_1$.

An output signal of the inverter $I_{1B}$ is inputted to an inverter $I_{2A}$ and an input terminal D of a D flip-flop $DF_2$. An output signal of the inverter $I_{2B}$ is inputted to one input terminal of a NAND circuit $N_2$ and the other input terminal of the NOR circuit $NO_1$. An inverted output signal from an inverted output terminal #Q of the D flip-flop $DF_2$ is inputted to the other input terminal of the AND circuit $AN_1$, and an output signal from an output terminal Q of the same D flip-flop $DF_2$ is inputted to one input terminal of an AND circuit $AN_2$. An output signal of the AND circuit $AN_2$ is inputted to the other input terminal of the NAND circuit $N_2$ and to one input terminal of a NOR circuit $NO_2$. An output signal of the NOR circuit $NO_1$ is inputted to an inverter $I_{3A}$ and an input terminal D of a D flip-flop $DF_3$. An output signal of the inverter $I_{3A}$ is inputted to one input terminal of a NAND circuit $N_3$ and to the other input terminal of the NOR circuit $NO_2$. An inverted output signal from an inverted output terminal #Q of the D flip-flop $DF_3$ is inputted to the other input terminal of the AND circuit $AN_2$, and an output signal from an output terminal Q is inputted to one input terminal of an AND circuit $AN_3$. An output signal of the AND circuit $AN_3$ is inputted to the other input terminal of the NAND circuit $N_3$.

Intermediate signals A1, A2, A3 ... which are the output signals of the NAND circuits $N_1, N_2, N_3$ ... are inputted to respective input terminal of the multi-input AND circuit $AN_0$, and an output clock signal C is outputted from the multi-input AND circuit $AN_0$. To each trigger terminal T of the D flip-flops $DF_1$, $DF_2$, $DF_3$, the reference signal B is commonly inputted.

A unit circuit $U_1$ is composed of the D flip-flop $DF_1$, the inverter $I_{1A}$, the inverter $I_{1B}$, the AND circuit $AN_1$ and the NAND circuit $N_1$. Also, a unit circuit $U_2$ ($U_3$) is composed of the D flip-flop $DF_2$ ($DF_3$), the inverter $I_{2A}$ ($I_{3A}$), the NOR circuit $NO_1$ ($NO_2$), the AND circuit $AN_2$ ($An_3$) and the NAND circuit $N_2$ ($N_3$). The unit circuits $U_2$ and $U_3$ have the same configuration. In an actual circuit, a plurality of unit circuits, for example, about fifty unit circuits configured as such, are connected in cascade, however, these unit circuits are omitted in the figure.

Figure 4:
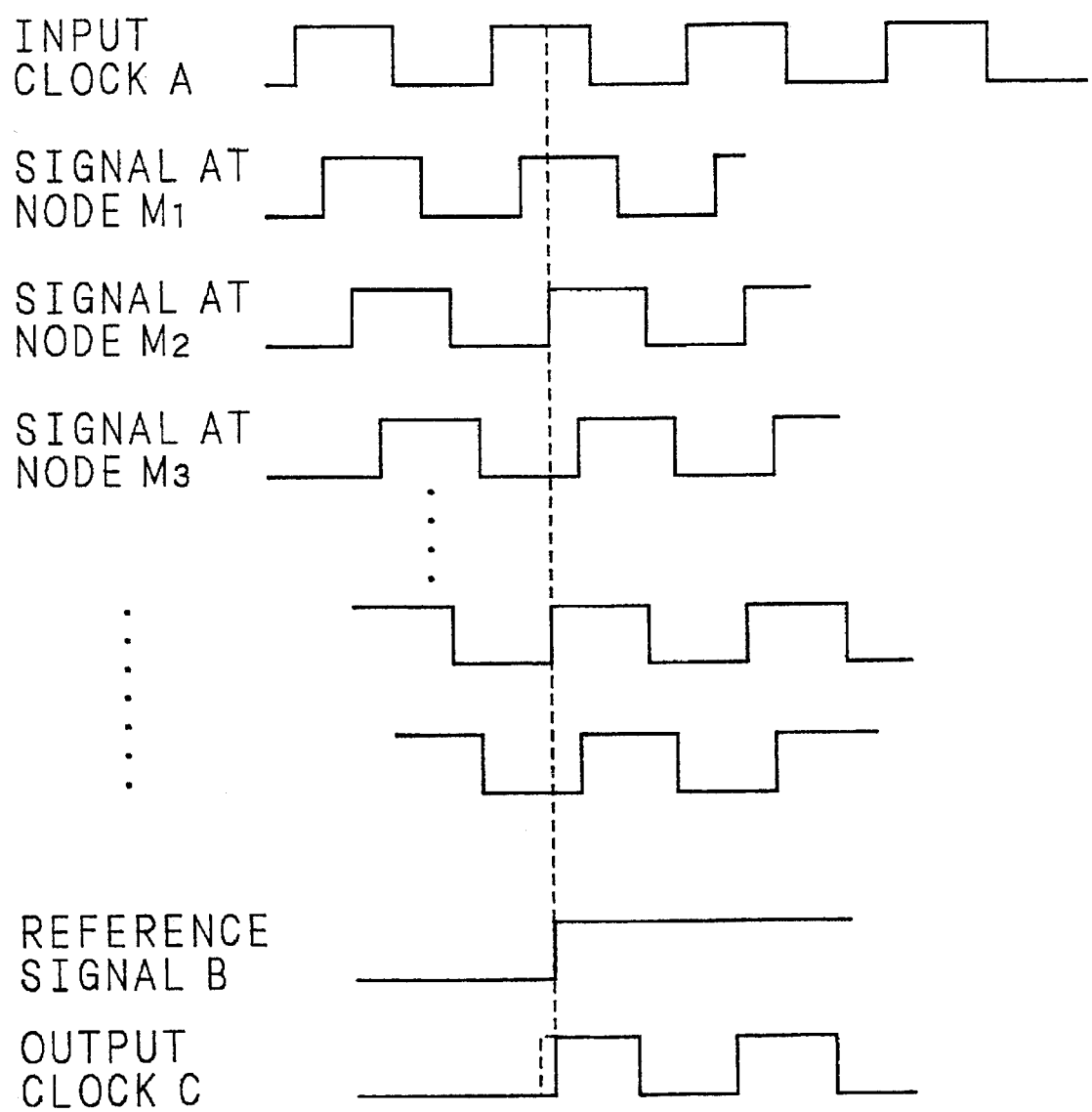
FIG. 4 is a timing chart of clocks and a signal of a clock generator in accordance with the present invention.

Next, an operation of the clock generator of the first embodiment in accordance with the present invention configured as mentioned above is described referring to a timing chart of relationship of the clock signals and the signal shown in FIG. 4.

When the input clock signal A is inputted to the clock generator of the present invention, it is transmitted through the inverters $I_{1A}$, $I_{1B}$, $I_{2A}$, NOR circuit $NO_1$, inverter $I_{3A}$ and NOR circuit $NO_2$ . . . successively. In general, in a case where a clock signal is inputted to an inverter, the inverter outputs the clock signal with a slight delay because the inverter has a delay time for a gate operation. Therefore, the phase of the input clock A is delayed slightly at every passage through the inverter, the clock signal phases at a node $M_1$ to which a signal is outputted from the inverter $I_{1B}$, at a node $M_2$ to which a signal is outputted from the inverter $I_{2B}$, and at a node $M_3$ to which a signal is outputted from the inverter $I_{3B}$ are delayed successively.

When the reference signal B rises, each D flip-flop $DF_1$, $DF_2$, $DF_3$ . . . latches simultaneously a value of the input clock A whose phase at each node $M_1$, $M_2$, $M_3$ . . . is delayed successively. Hereupon, because there are large number of the nodes $M_1$, $M_2$, $M_3$ . . . and the phase of the input clock signal A is delayed slightly at every node successively, each node enters a state of "H" or "L". Therefore, data latched by each D flip-flop becomes "H" or "L".

Also, a plurality of states are generated in which, between adjacent two D flip-flops, the D flip-flop positioned at the upstream side of the input clock A latches data of "H", and the D flip-flop positioned at the downstream side of the same latches data of "L". For example, when the D flip-flop $DF_2$ latches data of "H" and the D flip-flop $DF_3$ latches data of "L", the output signal of the AND circuit $AN_2$ becomes "H" and the NAND circuit $N_2$ to which the output signal of the AND circuit $AN_2$ is inputted enters a state in which it is able to transmit the clock signal. Therefore, the intermediate signal A2 which varies according to the input clock signal A is inputted to the multi-input AND circuit $AN_0$. On the other hand, because the output signal of the AND circuit $AN_2$ is "H", the NOR circuit $NO_2$ enters a state in which it is not possible to transmit the clock signal and cuts off the transmission of the input clock signal A to the unit circuits after the unit circuit $U_3$. Therefore, the intermediate signals outputted from NAND circuits of the unit circuits after the unit circuit $U_3$ are fixed to "H". That is, when both of the latch data of the adjacent two D flip-flop are in the states of "H", an output of the AND circuit to which both of the two latch data are inputted becomes "L" and an output signal of the NAND circuit to which the output signal of abovementioned AND circuit is inputted is fixed to "H".

By this reason, according to only one intermediate signal which varies in response to the input clock signal, the logic of the multi-input AND circuit $AN_0$ enters an established state or a not established state to generate the output clock signal C, so that the output clock signal C which is synchronized with the reference signal B and has same phase of the input clock signal A is generated from the multi-input AND circuit $AN_0$. By this operation, the rising timing of the output clock signal C is determined not according to the establishing timing of the logic of the plural intermediate signals which vary in response to the input clock, but to only one intermediate signal which varies in response to the input clock signal. Therefore, the rising timing of the output clock signal is not delayed even in the case where the frequency of the input clock signal A is high, and the duty of the output clock signal does not change even when the frequency of the input clock signal changes, thereby clock having a stable duty call be generated.

[Second Embodiment]

Figure 6:
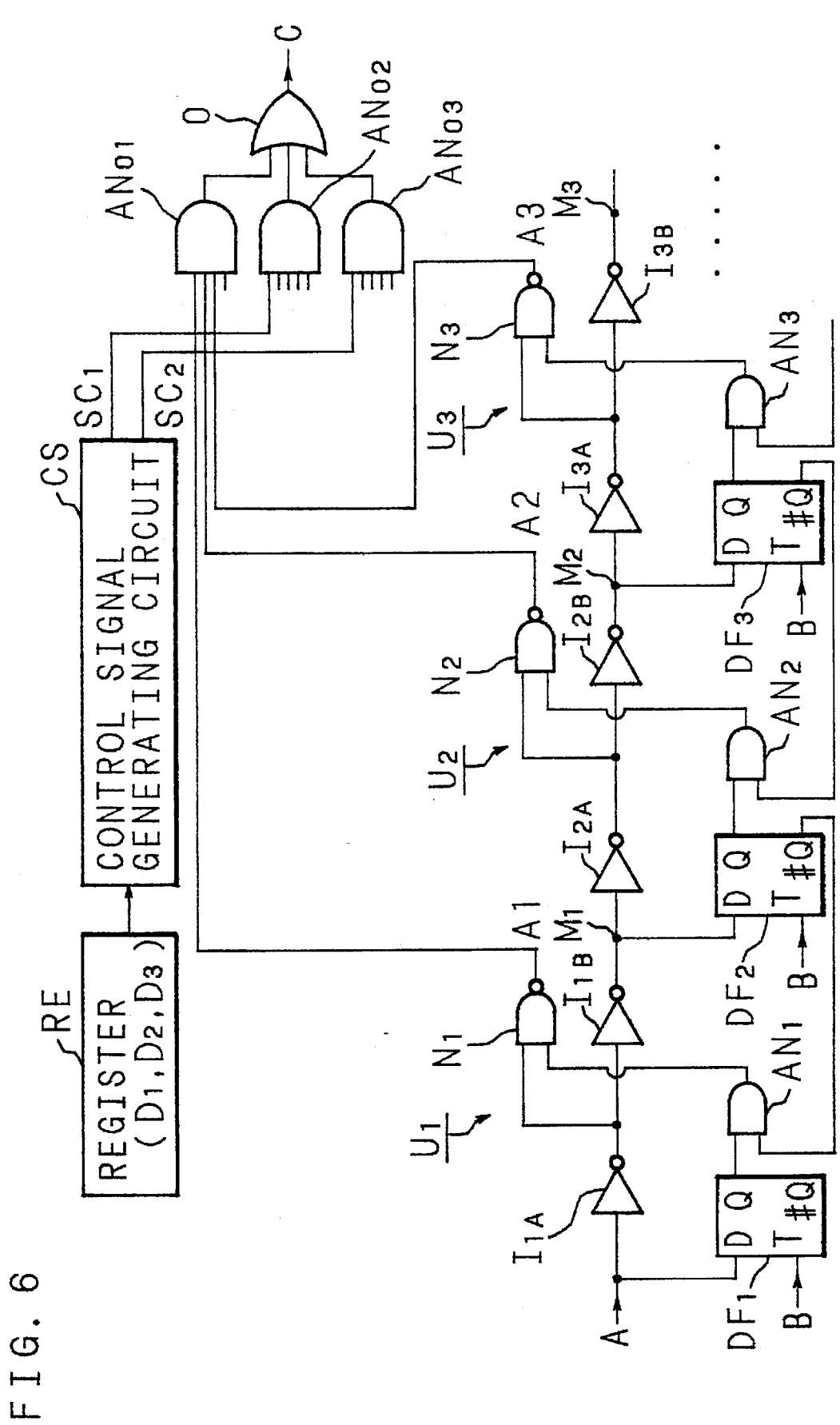
FIG. 6 is a logical circuit diagram showing a configuration example of a clock generator of a second embodiment in accordance with the present invention.

FIG. 6 is a logical circuit diagram showing a configuration example of the second embodiment of the clock generator in accordance with the present invention.

Figure 3:
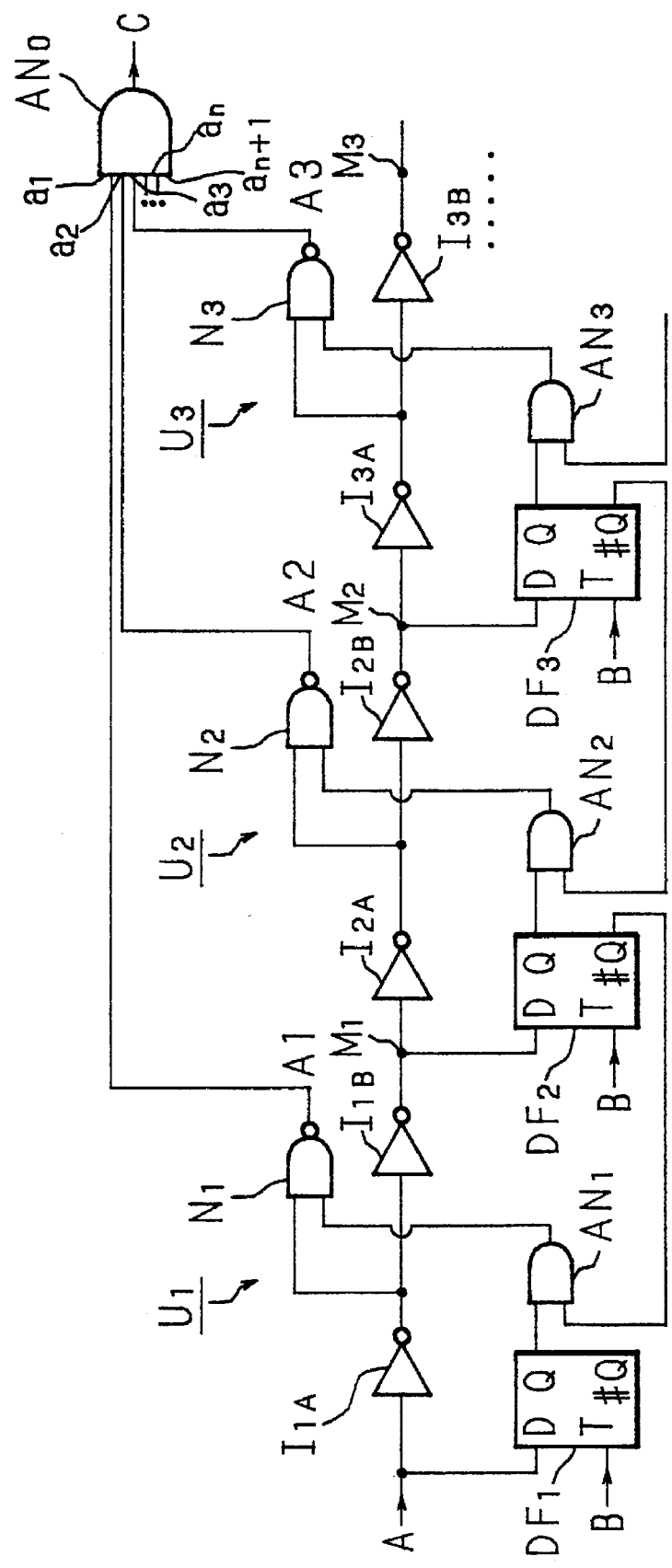
FIG. 3 is a logical circuit diagram showing a configuration example of a conventional clock generator.

There is provided with a register RE to which data corresponding to each predetermined frequency region are written, and the latch data is inputted to a control signal generating circuit CS. The control signal generating circuit CS is configured so as to decode the latch data inputted thereto and generate a control signal of "L". To a multi-input AND circuit $AN_{01}$, four intermediate signals A1, A2, A3 . . . of a first block consisting of, for example, four unit circuits including the unit circuits $U_1$, $U_2$, $U_3$ are inputted. Also, to the multi-input AND circuit $AN_{02}$, four intermediate signals of four unit circuits, not shown, of a second block next to the first block are inputted the same as abovementioned. Further, to the multi-input AND circuit $AN_{03}$, four intermediate signals of four unit circuits, not shown, of a third block next to the second block are inputted. Each output signal of the multi-input AND circuits $AN_{01}$, $AN_2$, $An_{03}$ is inputted to each input terminal of a three-input OR circuit 0 respectively. To the multi-input AND circuits $AN_{02}$ and $AN_{03}$, the control signal from the control signal generating circuit CS is inputted. Other configuration are the same as the conventional example shown in FIG. 3, and the same or corresponding portions are given with same reference numerals.

Next, an operation of the second embodiment of the clock generator in accordance with the present invention will be described.

To the register RE, data corresponding to each frequency region at every predetermined frequency region of the input clock signal is written. That is, the higher the frequency of the input clock signal becomes, as mentioned above, the more the number of states in which the D flip-flop positioned at upstream side of the input clock latches "H" and the D flip-flop positioned at downstream side of the same latches "L" between the adjacent two D flip-flops increases. Therefore, to the register RE, a control signal data $D_1$ is written in for a first frequency region of the input clock signal, a second control signal data $D_2$ is written in for a second frequency region 06 the same, and a third control signal data $D_3$ is written in for a third frequency region of the same.

Now, when the input clock A is inputted to the second embodiment of the clock signal generator in accordance with the present invention, it transmits the inverters $I_{1A}$, $I_{1B}$, $I_{2A}$, $I_{2B}$, $I_{3A}$, $I_{3B}$ . . . The phase of the input clock signal A is delayed slightly at every passage through the inverter by the abovementioned transmission delay of the inverters, the clock phase at nodes $M_1$, $M_2$ and $M_3$ successively.

At this time, when the reference signal B rises, each D flip-flop $DF_1$, $DF_2$, $DF_3$ . . . latches simultaneously a value of the input clock signal A whose phase at each node $M_1$, $M_2$, $M_3$ . . . is slightly delayed successively. Hereupon, because there are large number of the nodes $M_1$, $M_2$, $M_3$ . . . and phase of the input clock signal A is delayed slightly at every node successively, each node enters a state of "H" or "L". Therefore, data each D flip-flop becomes "H" or "L". Also, a plurality of states are generated in which, between adjacent two D flip-flops, the D flip-flop positioned at the upstream side of the input clock A latches data of "H", and the D flip-flop positioned at the downstream side of the same latches data of "L".

The higher the frequency of the input clock signal A becomes, the more the abovementioned state increases. Further, an intermediate signal as the output signal of the NAND circuit to which the output signal of "H" of the AND circuit to which such latch data of "H" and "L" are inputted becomes a plurality. The output clock signal C rises at the timing when the logic of those intermediate signals is established, and falls at the timing when the logic of the same is not established. Consequently, in the case where the frequency of the input clock signal is high, the timing at which the output clock signal C rises is delayed and the duty for the frequency of the output clock signal becomes small as mentioned above.

In this embodiment, however, the frequency of the input clock signal is detected, and when the detected frequency is in the first frequency region whose frequency is very high, the data corresponding to the first frequency region is read out from the register RE and inputted to the control signal generating circuit CS. As a result, the control signal generating circuit CS decodes the inputted control signal data and, in this case, outputs the control signals $SC_1$ and $SC_2$ of both "L". The control signals $SC_1$ and $SC_2$ of both "L" are inputted to the multi-input AND circuits $AN_{02}$ and $AN_{03}$ respectively. By this operation, the output signals of the multi-input AND circuits $AN_{02}$ and $AN_{03}$ are fixed to "L". That is, even when the intermediate signal which varies in response to the input clock signal A is inputted, the output signal of the multi-input AND circuits $AN_{02}$ and $AN_{03}$ don't correspond. On the other hand, in the case where the intermediate signal which is outputted from the unit circuit of the first block at the most upstream side of the input clock signal A and which varies in response to the input clock signal is inputted to the multi-input AND circuit $AN_{01}$, the output signal of the multi-input AND circuit $AN_{01}$ varies in response to the intermediate signal inputted thereto. Then, output signals of the multi-input AND circuits $AN_{01}$, $AN_{02}$ and $AN_3$ are inputted to the three-input OR circuit 0, and the three-input OR circuit 0 outputs the output clock signal C corresponding to the output signal of the multi-input AND circuit $AN_{01}$.

On the other hand, in the case where the frequency of the input clock signal is in the second frequency region whose frequency is lower than that of the first frequency region, the control signal $SC_2$ is inputted only to the multi-input AND circuit $AN_{03}$ corresponding to the data read out from the register RE, and the output signal of the multi-input AND circuit $AN_{03}$ is fixed to "L". That is, even when the intermediate signal which varies in response to the input clock signal is inputted to the multi-input AND circuit $AN_{03}$, the output signal of the multi-input AND $An_{03}$ doesn't correspond. In the case where the intermediate signal which is outputted from the two blocks of the unit at upstream side of the input clock signal A and varies in response to the input clock signal is inputted to the multi-input AND circuit $AN_{03}$, the output signals of the multi-input AND circuits $AN_{01}$ and $AN_{02}$ vary in response to the intermediate signal inputted thereto. Then, these output signals are inputted to the three-input OR circuit 0, and the output clock signal C rises by establishing of the logic of the output signals of the multi-input AND circuits $AN_{01}$ and $AN_{02}$, and it falls by not establishing of the same, thereby the output clock signal C in synchronism with the reference signal B and having same frequency of the input clock signal A is generated.

That is, in this embodiment, the intermediate signal outputted from the unit circuit of the specific block is controlled in each block not to vary corresponding to the frequency of the input clock signal, so that the intermediate signal which varies corresponding to the input clock signal is limited to only one. Thereby, in the case where input clock signals having various frequency are inputted, the output clock signal C whose rising timing does not change, whose duty does not become small, and whose duty is always stable is generated.

In addition, the embodiment is provided with three multi-input AND circuits to which the intermediate signals are inputted, and one OR circuit to which output signals of abovementioned three multi-input AND circuits are inputted, however it is not to say that those numbers are one example.

As described above, the first embodiment of the clock generator in accordance with the present invention is so configured that logical circuits are interposed at intermediate positions of a circuit which transmits the input clock signal, and signal number which varies according to the input clock signal is limited, thereby duty of the generated clock signal does not change even when frequency of the input clock signal changes.

Also, the second embodiment of the clock generator in accordance with the present invention is so configured that the signal which varies corresponding to the input clock signal is limited to only one by data which is predetermined in response to the frequency region of the input clock signal, so that duty of the generated clock signal does not change even when frequency of the input clock signal changes. In this invention, therefore, there is no affair to be short of operation margin of the object to be driven by the generated clock signal, and to provide a clock signal generator which generates a clock for stably driving the object.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A clock generator, comprising:
a first unit circuit including a first inverter to which a clock signal is inputted, a second inverter which is connected to said first inverter in series, a first latch circuit to which said clock signal and a reference signal are inputted, a first logical circuit to which an output signal of said first latch circuit is inputted, and a second logical circuit to which an output signal of said first logical circuit and an output signal of said first inverter are inputted;
a plurality of second unit circuits each including a third inverter to which a clock signal is inputted, a third logical circuit to which an output signal of said third inverter is inputted, a second latch circuit to which the clock signal being inputted to said third inverter and the reference signal are inputted, a fourth logical circuit to which an output signal of said second latch circuit is inputted, and a fifth logical circuit to which an output signal of said fourth logical circuit and an output signal of said third inverter are inputted, each of said second unit circuits forming a stage in said clock generator; and a multi-input logical circuit including plural inputs to which an output signal of said second logical circuit and each output signal of said plurality of fifth logical circuits are connected;

wherein, said second unit circuits are connected in cascade so as to input the output signal of said third logical circuit of each said second unit to said third inverter of other second unit, said second inverter of said first unit circuit is connected to said third inverter of said second unit circuit of a first of the stages so as to input the output signal of the second inverter of the first unit circuit to the third inverter of the second unit circuit, an inverted output signal of said second latch circuit of said second unit circuit of the first of the stages is inputted to said first logical circuit of said first unit circuit, an inverted output signal of said second latch circuit of said second unit circuit of a succeeding stage is inputted to said fourth logical circuit of said second unit circuit of a preceding stage, the output signal of said first unit circuit and the output signal of each of the second unit circuits is inputted to said third logical circuit of said second unit circuit of a succeeding stage, and the output signal of said fourth logical circuit of each said second unit circuit is inputted to said third logical circuit of said second unit circuit of a succeeding stage.

2. A clock generator, comprising a plurality of unit circuits each including a first inverter to which a clock signal is inputted, a second inverter which is connected to said first inverter in series, a latch circuit to which said clock signal and a reference signal are inputted, a first logical circuit to which an output signal of said latch circuit is inputted, and a second logical circuit to which an output signal of said first logical circuit and an output signal of said first inverter are inputted, wherein an output signal of said second inverter of one unit circuit is inputted to said first inverter of the other unit circuit, and latch data of the latch circuit of the other unit circuit is inputted to said first logical circuit of one unit circuit so as to connect each unit circuit in series, said clock generator further comprising:

a register for storing data corresponding to the frequency regions of said clock signal;

a signal generating circuit for generating a control signal based on the data of said register; and a logical circuit to which the control signal outputted from said signal generating circuit and the output signal of said second logical circuit of each unit circuits are inputted.

* * * * *